(12) United States Patent
Wang et al.

(10) Patent No.: US 10,802,637 B1
(45) Date of Patent: Oct. 13, 2020

(54) TOUCH-SENSING DISPLAY PANEL AND METHOD OF MANUFACTURING THE SAME

(71) Applicant: Unimicron Technology Corp., Taoyuan (TW)

(72) Inventors: Tse-Wei Wang, Hsinchu (TW); Cheng-Ta Ko, Taipei (TW)

(73) Assignee: UNIMICRON TECHNOLOGY CORP., Taoyuan (TW)

( * ) Notice: Subject to any disclaimer, the term of this patent is extended or adjusted under 35 U.S.C. 154(b) by 0 days.

(21) Appl. No.: 16/509,462

(22) Filed: Jul. 11, 2019

(30) Foreign Application Priority Data

May 14, 2019 (TW) ............................... 108116611 A (51) Int. Cl.
| | | |
|---|---|---|
| *G06F 3/041* | (2006.01) | |
| *H01L 33/52* | (2010.01) | |
| *H01L 33/50* | (2010.01) | |
| *H01L 33/62* | (2010.01) | |

(52) U.S. Cl.
CPC .......... *G06F 3/0412* (2013.01); *H01L 33/507* (2013.01); *H01L 33/52* (2013.01); *H01L 33/62* (2013.01); *G06F 2203/04107* (2013.01); *H01L 2933/005* (2013.01); *H01L 2933/0041* (2013.01); *H01L 2933/0066* (2013.01)

(58) Field of Classification Search
CPC ......... G06F 3/0412; G06F 2203/04107; H01L 33/507; H01L 33/52; H01L 33/62; H01L 2933/0041; H01L 2933/005; H01L 2933/0066; H01L 27/323
See application file for complete search history.

(56) References Cited

U.S. PATENT DOCUMENTS

2015/0250038 A1    9/2015 Sakuishi et al.
2019/0258346 A1*   8/2019 Cheng ................. H01L 27/1214

FOREIGN PATENT DOCUMENTS

| TW | 201115210 A | 5/2011 |
|----|-------------|--------|
| TW | I367465 B | 7/2012 |
| TW | 201546673 A | 12/2015 |
| TW | 201610773 A | 3/2016 |
| TW | 201640593 A | 11/2016 |
| TW | M553882 U | 1/2018 |
| TW | 201913337 A | 4/2019 |

\* cited by examiner

*Primary Examiner* — Alexander Eisen
*Assistant Examiner* — Nathaniel P Brittingham
(74) *Attorney, Agent, or Firm* — CKC & Partners Co., LLC (57) ABSTRACT

A touch-sensing display panel includes a substrate, a first circuit layer, a LED chip, a second circuit layer, a blocking wall, a second wire, and a third wire. The first circuit layer is on the substrate, including at least one first electrode, and a first wire. The LED chip is on and electrically connected to the first electrode. The second circuit layer is on the first circuit layer, including a second electrode, a touch sensing line, and a touch driving line. The blocking wall, the second wire, and the third wire are on the second circuit layer. The second wire extends to an inner sidewall and a top surface of the blocking wall, and electrically connects to the touch sensing line. The third wire extends to an outer sidewall of the blocking wall, and electrically connects to the touch driving line.

15 Claims, 9 Drawing Sheets

TOUCH-SENSING DISPLAY PANEL AND METHOD OF MANUFACTURING THE SAME

CROSS-REFERENCE TO RELATED APPLICATION

This application claims priority to Taiwan Application Serial Number 108116611, filed May 14, 2019, which is herein incorporated by reference.

BACKGROUND

Field of Invention

The present disclosure relates to a touch touch-sensing display panel and method of manufacturing the same.

Description of Related Art

Touch-sensing display panels have been widely used in various electronic products, such as tablet computer, smart phone, and the like. In the manufacturing process of the current touch-sensing display panels, a touch module is usually formed first, and then assembled with a display panel. The issues of Moiré effects and decreasing brightness due to the touch module shielding the display panel are thereby caused. The Moiré effects cause a poor visual perception, such as rainbow pattern when a user views the screen at a specific angle. In addition, the touch module and the display panel require high-precision laminating process, which results in poor yield and high cost. Therefore, there is a demand for a novel touch-sensing display panel for solving the above problems.

SUMMARY

In accordance with an aspect of the present disclosure, a touch touch-sensing display panel is provided. The touch touch-sensing display panel includes a substrate, a first circuit layer, a light-emitting diode chip, a second circuit layer, a blocking wall, a second wire, and a third wire. The first circuit layer is disposed on the substrate, wherein the first circuit layer includes at least one first electrode and a first wire. The light-emitting diode chip is disposed on and electrically connected to the first electrode. The second circuit layer is disposed on the first circuit layer, wherein the second circuit layer includes a second electrode, a touch sensing line and a touch driving line, and the touch driving line is electrically connected to the first wire. The blocking wall is disposed on the second circuit layer and surrounds the light-emitting diode chip, wherein the blocking wall has an inner sidewall, an outer sidewall and an upper surface, and the inner sidewall faces the light-emitting diode chip. The second wire is disposed on the second circuit layer and extends to the inner sidewall and the upper surface of the blocking wall, wherein the second wire is electrically connected to the touch sensing line. The third wire is disposed on the second circuit layer and extends to the outer sidewall of the blocking wall, wherein the third wire is electrically connected to the touch driving line.

According to some embodiments of the present disclosure, the touch touch-sensing display panel further comprises an encapsulant layer between the inner sidewalls of the blocking wall and covering the light-emitting diode chip.

According to some embodiments of the present disclosure, the encapsulant layer comprises phosphor.

According to some embodiments of the present disclosure, the touch touch-sensing display panel further comprises a protective layer on the blocking wall and the second wire.

According to some embodiments of the present disclosure, the touch touch-sensing display panel further comprises a blue light barrier layer on the blocking wall and the second wire.

According to some embodiments of the present disclosure, the blocking wall has a thickness, the second wire has a length extending to the upper surface of the blocking wall, and the length is at least one third of the thickness of the blocking wall.

According to some embodiments of the present disclosure, the light-emitting diode chip is micro light-emitting diode chip.

Another aspect of the present disclosure, a method of manufacturing a touch touch-sensing display panel is provided. The method includes following operations: forming a precursor substrate comprising a substrate; a first circuit layer disposed on the substrate, wherein the first circuit layer comprises at least one first electrode and a first wire; a light-emitting diode chip disposed on and electrically connected to the first electrode; and a second circuit layer disposed on the first circuit layer, wherein the second circuit layer comprises a second electrode, a touch sensing line and a touch driving line, wherein the second electrode is electrically connected to the light-emitting diode chip, and the touch driving line is electrically connected to the first wire; forming a blocking wall on the second circuit layer, wherein the blocking wall surrounds the light-emitting diode chip; and forming a second wire and a third wire on the second circuit layer, wherein the second wire is electrically connected to the touch sensing line, and the third wire is electrically connected to the touch driving line.

According to some embodiments of the present disclosure, the blocking wall has an inner sidewall, an outer sidewall and an upper surface, the second wire extends to the inner sidewall and the upper surface of the blocking wall, and the third wire extends to the outer sidewall of the blocking wall.

According to some embodiments of the present disclosure, the method further includes forming an encapsulant layer covering the light-emitting diode chip.

According to some embodiments of the present disclosure, the encapsulant layer includes phosphor.

According to some embodiments of the present disclosure, the method further comprises forming a protective layer on the blocking wall and the second wire.

According to some embodiments of the present disclosure, the blocking wall has a thickness, the second wire has a length extending to the upper surface of the blocking wall, and the length is at least one third of the thickness of the blocking wall.

According to some embodiments of the present disclosure, wherein forming the precursor substrate includes following operations: forming the first electrode and the first wire on the substrate; forming the light-emitting diode chip on and electrically connected to the first electrode, wherein the light-emitting diode chip has a top surface; forming a first dielectric material layer on the substrate covering the first electrode and the first wire, wherein the first dielectric material layer has a top surface and a first opening, the top surface of the first dielectric material layer is flush with the top surface of the light-emitting diode chip, and the first opening exposes the first wire; forming the second electrode, the touch sensing line, and the touch driving line on the first dielectric material layer, wherein the second electrode is electrically connected to the light-emitting diode chip, and the touch driving line is electrically connected to the first wire by a first conductive contact; and forming a second dielectric material layer on the first dielectric material layer, wherein the second dielectric material layer has the second opening, a third opening, and a fourth opening, the second opening exposes the light-emitting diode chip, the third opening exposes the touch sensing line, and the fourth opening exposes the touch driving line.

According to some embodiments of the present disclosure, the second wire is electrically connected to the touch sensing line by a second conductive contact, and the third wire is electrically connected to the touch driving line by a third conductive contact.

It is to be understood that both the foregoing general description and the following detailed description are by examples, and are intended to provide further explanation of the invention as claimed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following embodiments are disclosed with accompanying diagrams for detailed description. For illustration clarity, many details of practice are explained in the following descriptions. However, it should be understood that these details of practice do not intend to limit the present invention. That is, these details of practice are not necessary in parts of embodiments of the present invention. Furthermore, for simplifying the drawings, some of the conventional structures and elements are shown with schematic illustrations.

Furthermore, spatial relative terms, such as "below", "under", "above", "over", etc., are intended to facilitate description of the relative relationship between a component or feature and another component or feature, as shown in the drawings. The true meaning of these spatial relative terms includes other orientations. For example, when the illustration is flipped up and down by 180 degrees, the relationship between a component and another component may change from "below" or "under" to "above" or "over". Furthermore, the spatial relative narratives used herein should be interpreted the same.

Although below using a series of actions or steps described in this method disclosed, but the order of these actions or steps shown should not be construed to limit the present invention. For example, certain actions or steps may be performed in different orders and/or concurrently with other steps. Moreover, not all steps must be performed in order to achieve the depicted embodiment of the present invention. Furthermore, each operation or procedure described herein may contain several sub-steps or actions.

Figure 1:
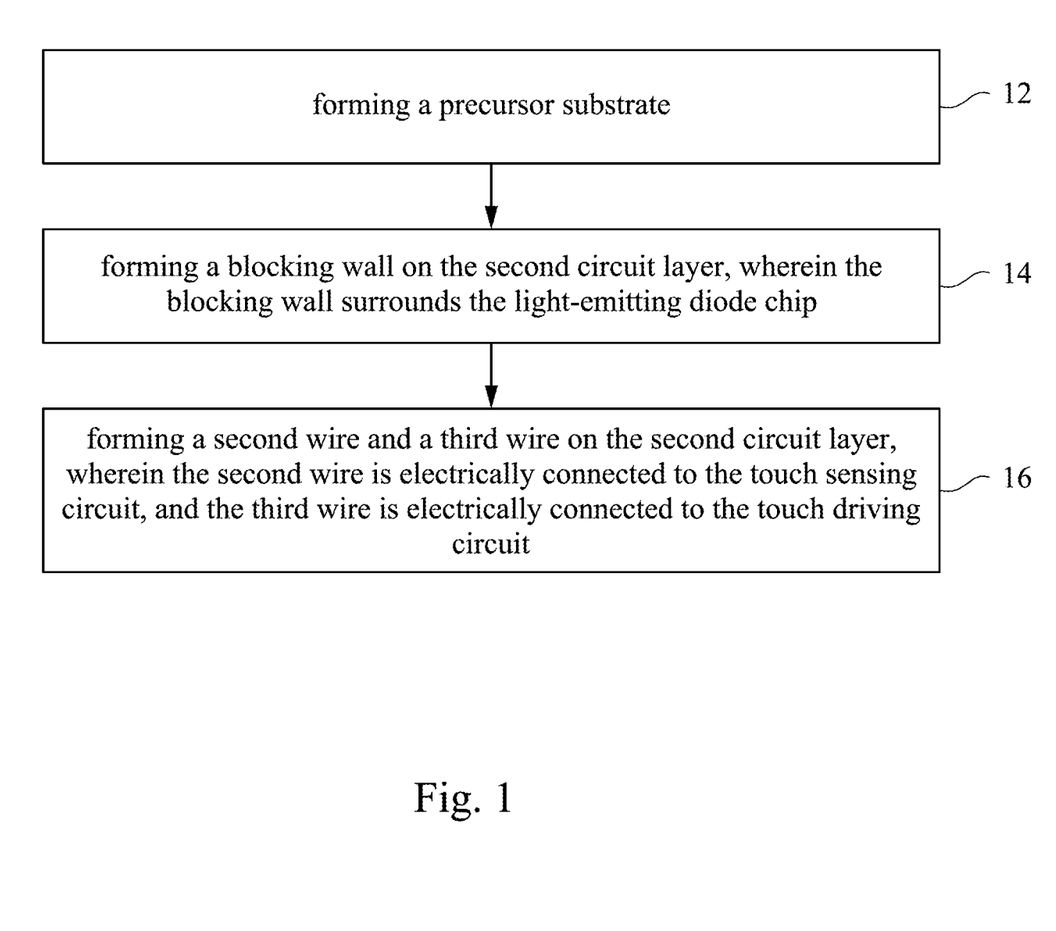
FIG. 1 is a flow chart of a method of manufacturing a touch-sensing display panel according to some embodiments of the present disclosure.

FIG. 1 is a flow chart of a method 10 of manufacturing a touch-sensing display panel 1000 according to various embodiments of the present disclosure. As shown in FIG. 1, the method 10 includes operation 12, operation 14, and operation 16. FIGS. 2-9 are cross-sectional views at various stages of method 10 according to some embodiments of the present disclosure.

Please refer to FIG. 1, in the operation 12 of the method 10, a precursor substrate 100 is formed. FIGS. 2-6 illustrate the detail steps of implementing operation 12 in accordance with an embodiment of the present disclosure. Please refer to FIG. 2, first electrodes 220a, 220b, and a first wire 230 are formed on the substrate 110.

Figure 2:
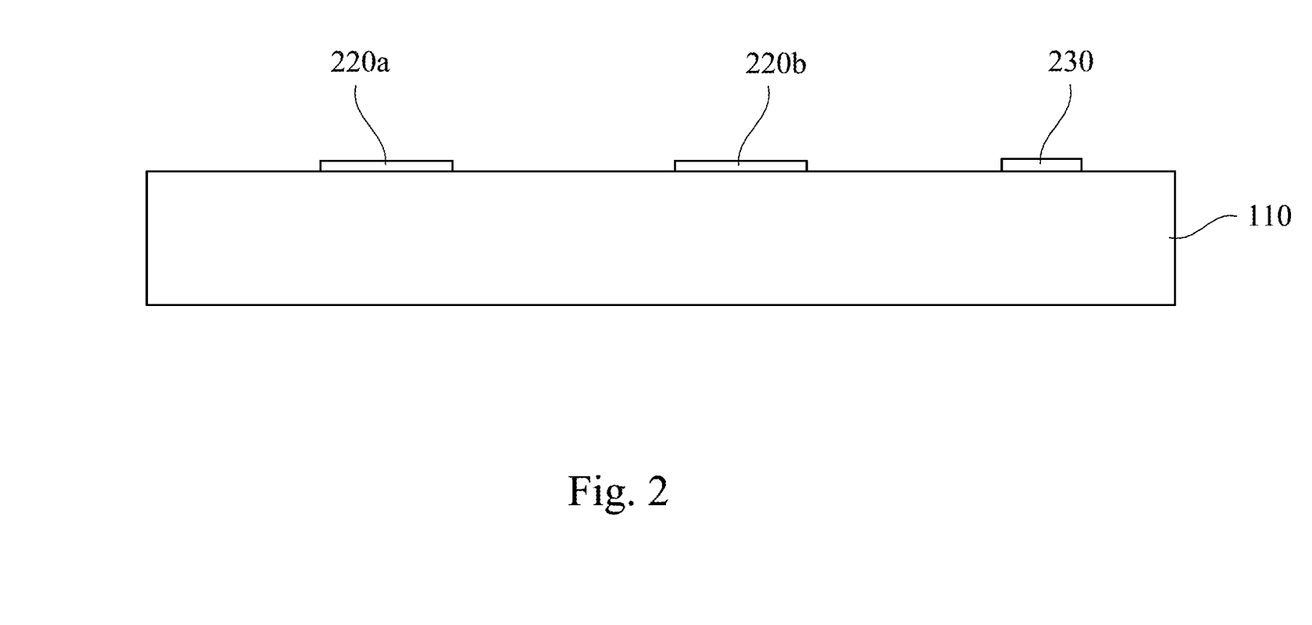
FIG. 2 to FIG. 9 are cross-sectional views at various stages of manufacturing method according to some embodiments of the present disclosure.

In some embodiments, the substrate 110 may be a non-flexible substrate. In some examples, the substrate 110 includes glass substrate, ceramic substrate, metal substrate, or circuit board, but is not limited thereto. In other embodiments, the substrate 110 may be a flexible substrate, for example, polymer material substrate.

In some embodiments, the first electrodes 220a, 220b may include any suitable conductive materials. In some examples, the first electrodes 220a, 220b include platinum (Pt), titanium nitride (TiN), gold (Au), titanium (Ti), tantalum (Ta), tantalum nitride (TaN), tungsten (W), tungsten nitride (WN), copper (Cu), or a combination thereof, but are not limited thereto. In some embodiments, only one of the first electrodes 220a, 220b is formed.

The first wire 230 may include any suitable conductive materials. In some examples, the first wire 230 includes silver (Ag), nickel (Ni), copper (Cu), gold (Au), palladium (Pd), or a combination thereof, but is not limited thereto. In some embodiments, the material of the first wire 230 may be same as or similar to the first electrodes 220a, 220b.

Figure 3:
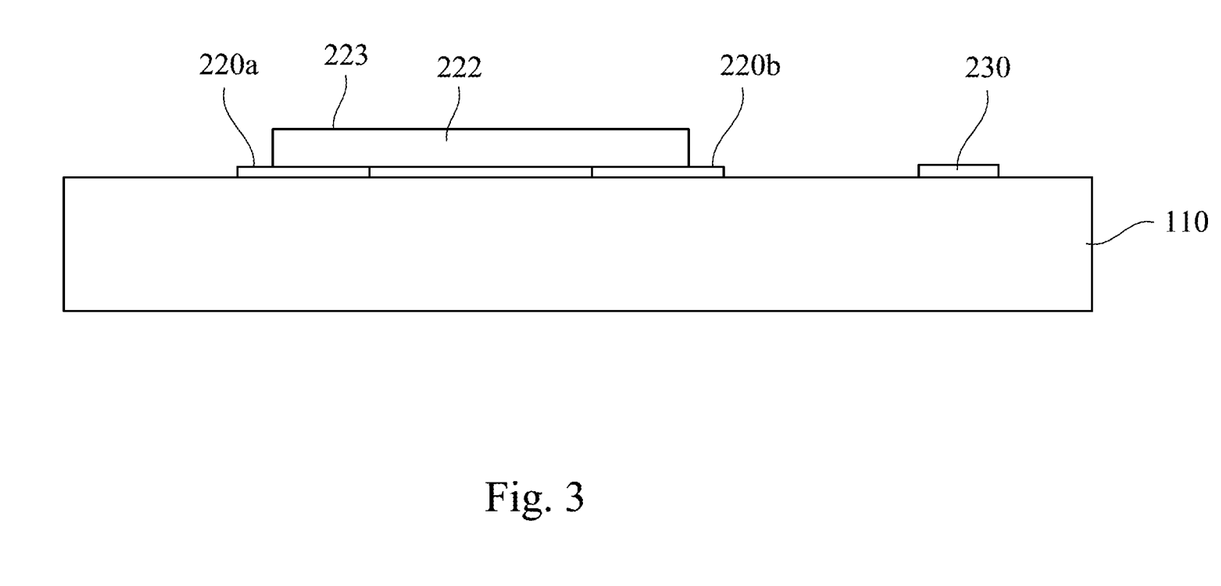

Next, please refer to FIG. 3, a light-emitting diode (LED) chip 222 is formed on the first electrode 220a and is electrically connected to the first electrode 220a and/or first electrode 220b. A top surface 223 of the LED chip 222 may be a light-emitting surface. In some embodiments, the LED chip 222 may be a blue LED chip, a red LED chip, or a green LED chip, but is not limited thereto. In some embodiments, the LED chip 222 may be a Micro LED. In some embodiments, the first electrodes 220a and 220b may be a cathode and an anode respectively and are electrically connected to the LED chip 222. In other embodiments, only one of the first electrodes 220a, 220b is formed as a cathode to electrically connect to the LED chip 222.

Figure 4:
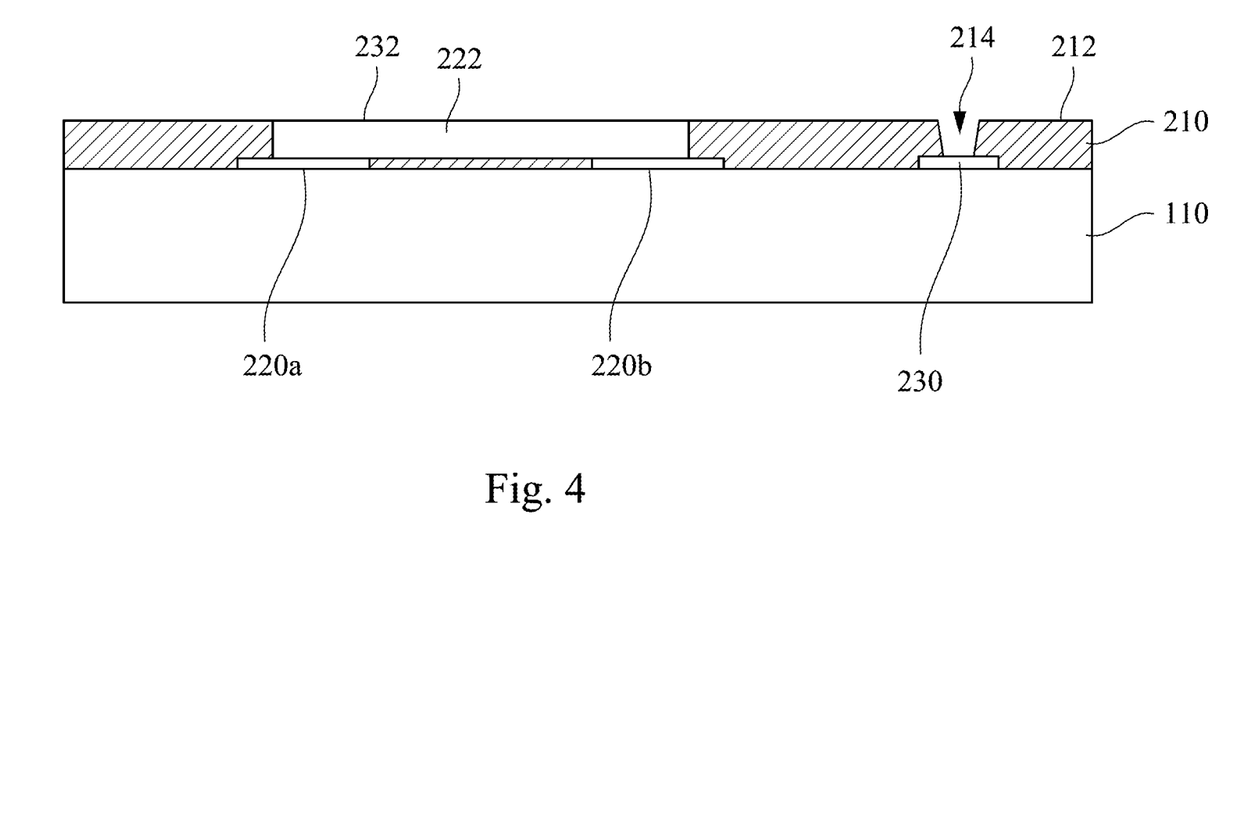

Next, please to FIG. 4, a first dielectric material layer 210 is formed on the substrate 110 and covers the first electrodes 220a, 220b, and first wire 230. In some embodiments, a top surface 212 of the first dielectric material layer 210 is flush with a top surface 223 of the LED chip 222. That is, the first dielectric material layer 210 exposes the top surface 223 of the LED chip 222. In some embodiments, the top surface 212 of the first dielectric material layer 210 and the top surface 223 of the LED chip 222 are substantially flat surfaces. As shown in FIG. 4, the first electrodes 220a, 220b and the first wire 230 are embedded in the first dielectric material layer 210, and an opening 214 exposes the first wire 230. In some embodiments, the first dielectric material layer 210 may include any suitable dielectric materials. In some examples, the first dielectric material layer 210 includes epoxy, Ajinomoto Build-up Film (ABF), prepreg (PP), polyimide (PI), or photoimageable dielectric (PID), and the like, but is not limited thereto. In some embodiments, the first dielectric material layer 210 can be formed on the substrate 110 by roll laminating, thermal laminating, or any suitable method.

Figure 5:
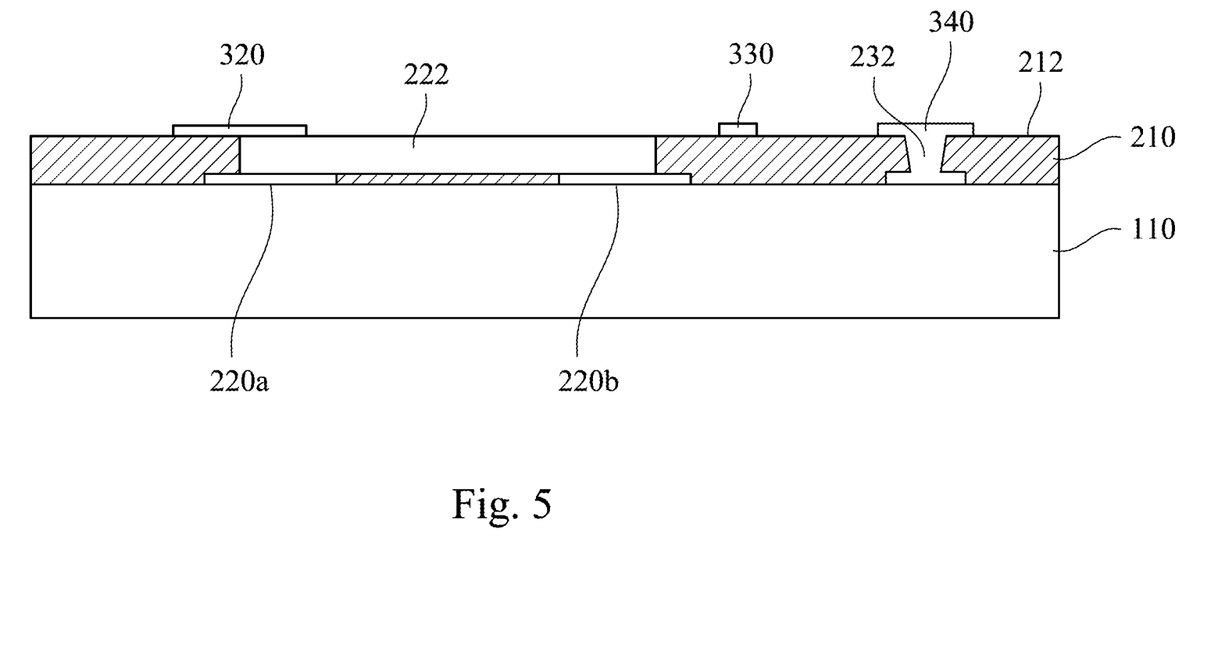

Please refer to FIG. 5, a second electrode 320, a touch sensing line 330, and a touch driving line 340 are formed on the first dielectric material layer 210. In some embodiments, the first electrode 220a and the second electrode 320 may be a cathode and an anode respectively and are electrically connected to the LED chip 222. In some embodiments, the first electrode 220b and the second electrode 320 may be a cathode and an anode respectively and are electrically connected to the LED chip 222. In some examples, the material of the second electrode 320 may be same as or similar to the first electrodes 220a, 220b. As shown in FIG. 5, in some embodiments, the first conductive contact 232 is formed in the opening 214 (shown in FIG. 4), and the touch driving line 340 is electrically connected to the first wire 230 (shown in FIG. 4) through the first conductive contact 232. The touch sensing line 330 can be electrically connected to a touch sensing circuit and a processor (not shown). The touch driving line 340 can be electrically connected to a touch driving circuit (not shown). In some examples, the material of the first conductive contact 232, the touch sensing line 330, and the touch driving line 340 may be same as or similar to the first wire 230.

Figure 6:
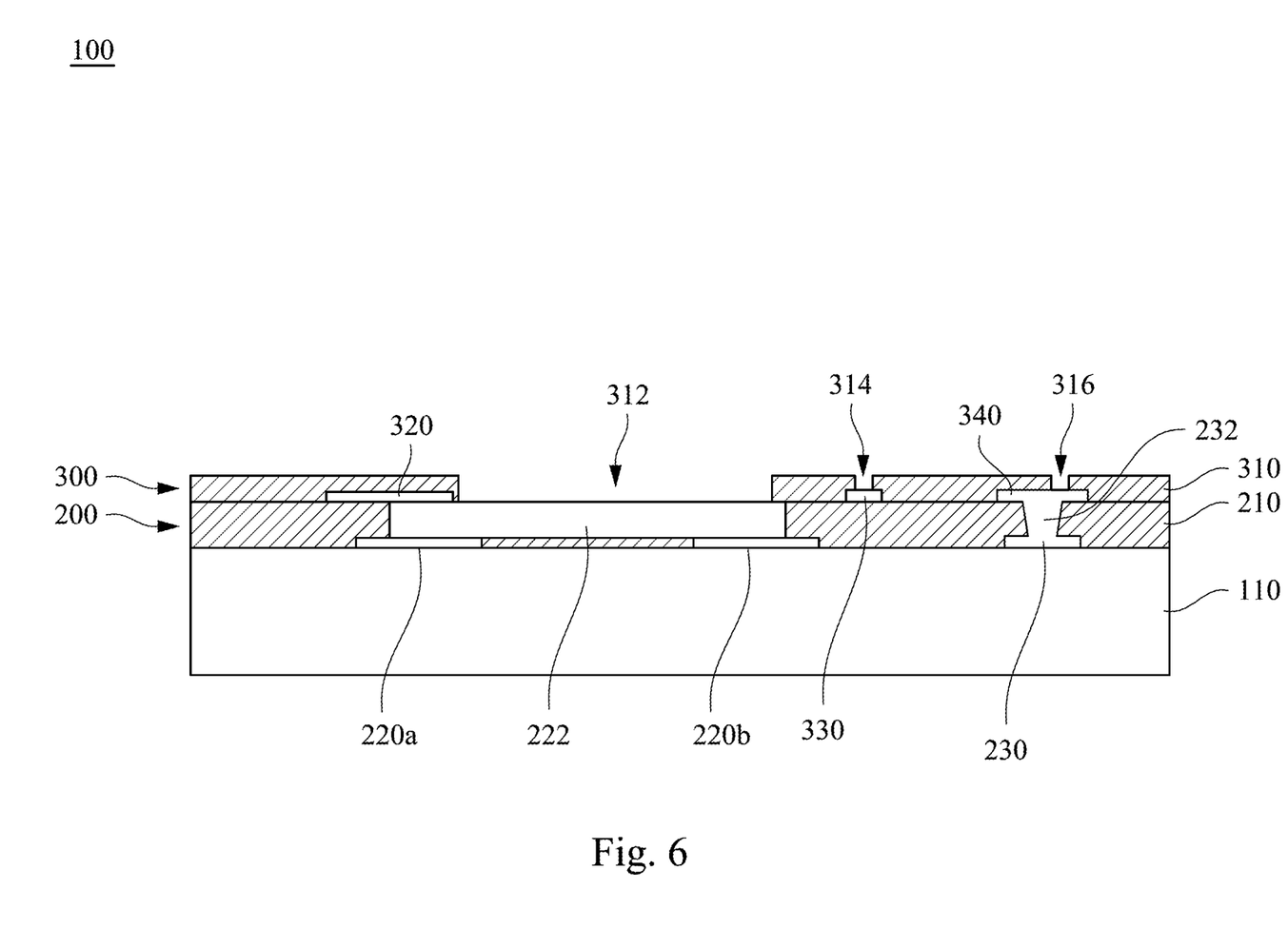

Please refer to FIG. 6, a second dielectric material layer 310 is formed on the first dielectric material layer 210. The second dielectric material layer 310 has openings 312, 314, and 316. As shown in FIG. 6, the opening 312 exposes a portion of the LED chip 222, the opening 314 exposes a portion of the touch sensing line 330, and the opening 316 exposes a portion of the touch driving line 340. In some embodiments, the method of forming the second dielectric material layer 310 may be same as or similar to the method of forming the first dielectric material layer 210. In some examples, the material of the second dielectric material layer 310 may be same as or similar to the first dielectric material layer 210.

At this time, as shown in FIG. 6, the precursor substrate 100 is formed. The precursor substrate 100 includes the substrate 110, the first circuit layer 200, the LED chip 222, and the second circuit layer 300. The first circuit layer 200 is disposed on the substrate 110 and includes the aforementioned first electrodes 220a, 220b and the first wire 230. The LED chip 222 is disposed on and electrically connected to the first electrode 220a. The second circuit layer 300 is disposed on the first circuit layer 200 and includes the aforementioned second electrode 320, the touch sensing line 330, and the touch driving line 340. The opening 312 of the second circuit layer 300 exposes the LED chip 222, and the touch driving line 340 is electrically connected to the first wire 230.

Figure 7:
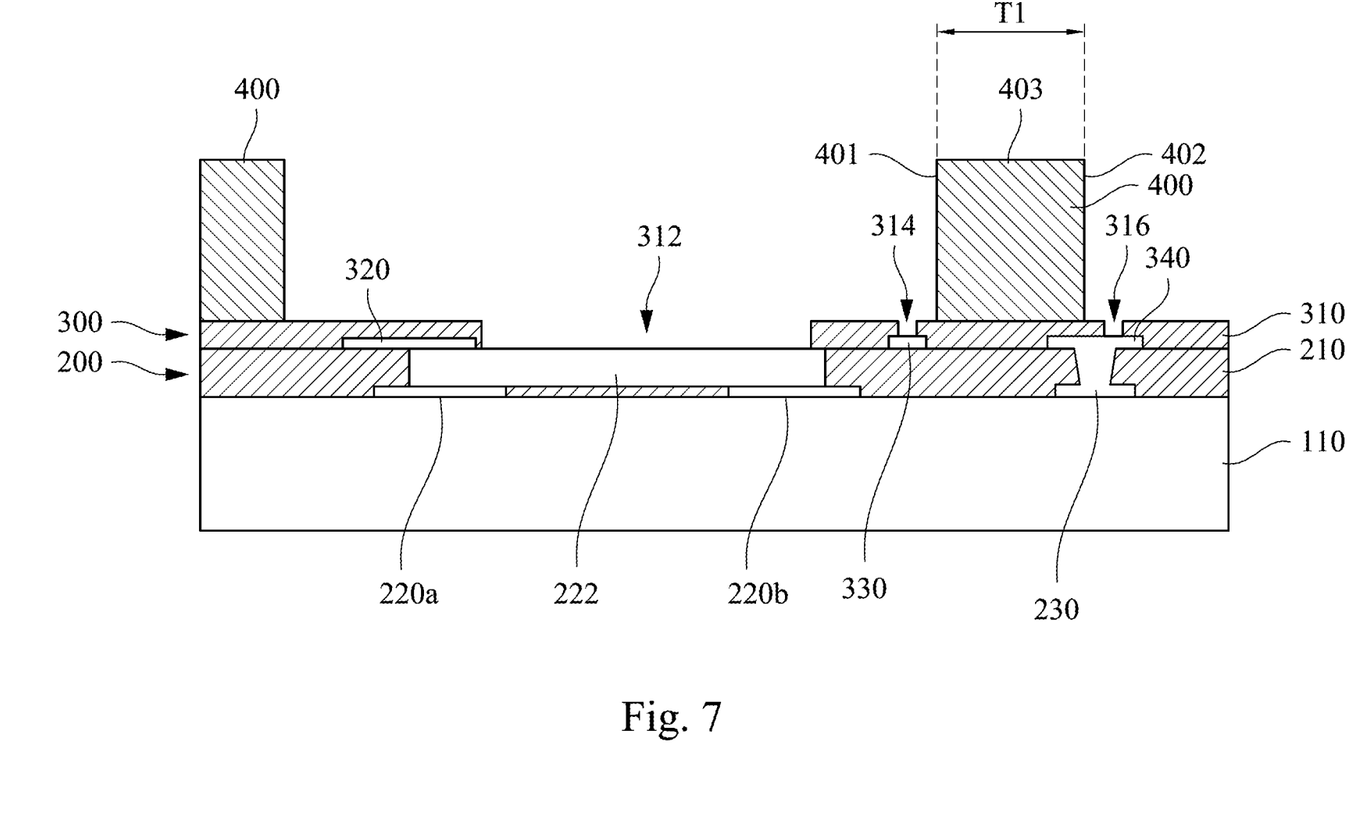

Please refer to FIG. 1 and FIG. 7, in the operation 14 of the method 10, the blocking wall 400 is formed on the second circuit layer 300 and surrounds the LED chip 222. As shown in FIG. 7, the blocking wall 400 has an inner sidewall 401, an outer sidewall 402, an upper surface 403, and a thickness T1. Specifically, a portion of the blocking wall 400 is formed between the opening 314 and opening 316 of the second dielectric material layer 310. The blocking wall 400 surrounds the opening 312, and the inner sidewall 401 of the blocking wall 400 faces to the LED chip 222. The blocking wall 400 may be disposed between a plurality of LED chips, for example, between LED chip 222 and a LED chip (not shown) adjacent to the LED chip 222 to separate LED chips. The blocking wall 400 can reflect or absorb a light emitted by the LED chip to avoid a light interference of between the plurality of LED chips. In some embodiments, the blocking wall 400 may be photoimageable dielectric, but is not limited thereto. In some examples, the blocking wall 400 may include light-absorbing particles distributed therein. In some embodiments, the blocking wall 400 can be formed by spin coating process and patterning process.

Figure 8:
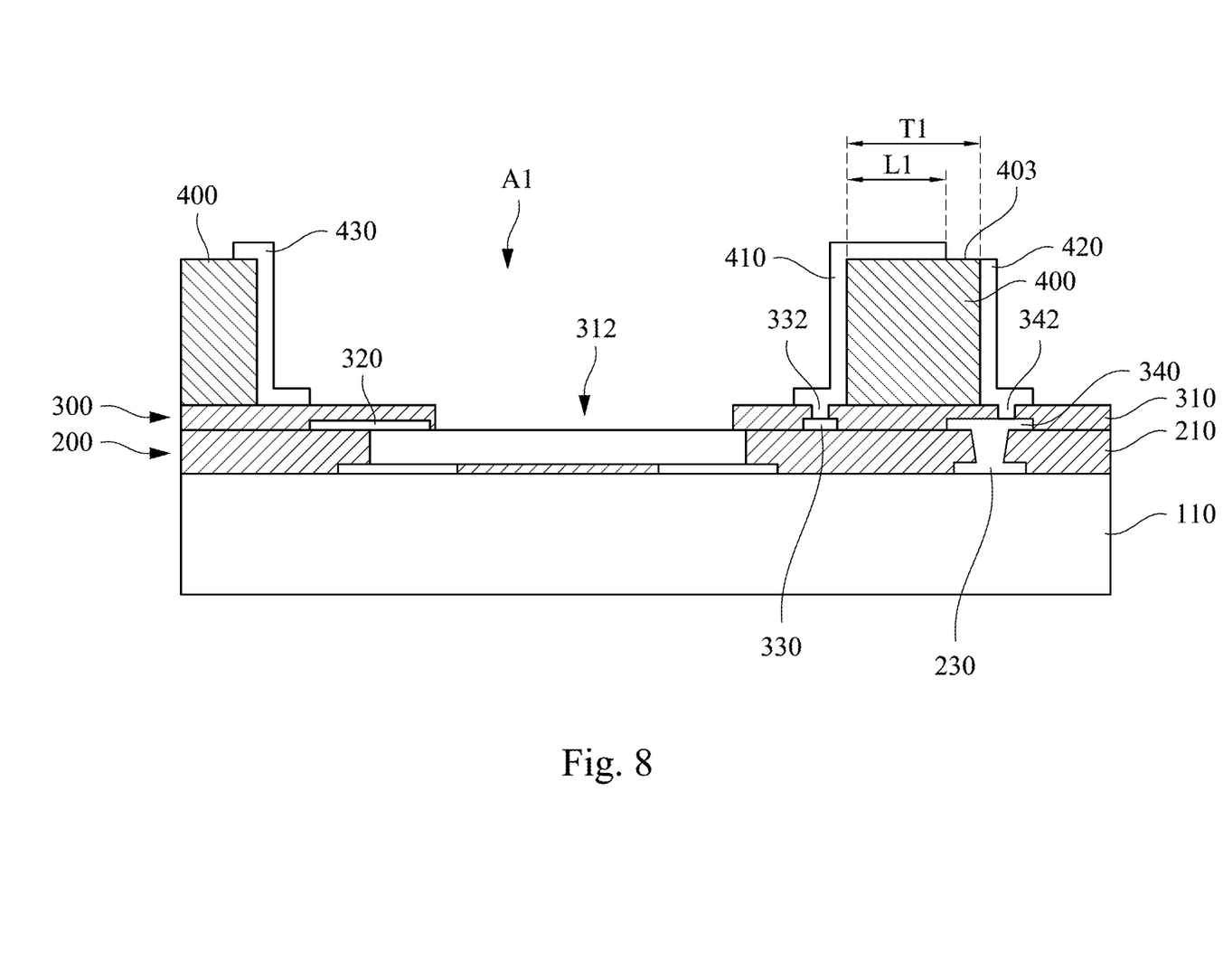

Please refer to FIG. 1 and FIG. 8, in the operation 16 of the method 10, a second wire 410 and a third wire 420 are formed on the second circuit layer 300, wherein the second wire 410 is electrically connected to the touch sensing line 330, and the third wire 420 is electrically connected to the touch driving line 340. In some embodiments, the second wire 410 may be electrically connected to the touch sensing line 330 through a second conductive contact 332 formed in the opening 314 (shown in FIG. 7). In some embodiments, the third wire 420 may be electrically connected to the touch driving line 340 through a third conductive contact 342 formed in the opening 316 (shown in FIG. 7). In some embodiments, the second wire 410 and the third wire 420 may include any suitable conductive materials. In some examples, the material of the second conductive contact 332 and the third conductive contact 342 may be same as or similar to the first conductive contact 232. In some embodiments, the second wire 410 and the third wire 420 may be formed by lift-off process. For example, the process may include, but is not limited to following operations: coating a photoresist material on the precursor substrate 100 and the blocking wall 400, and forming a patterned photoresist (not shown) by exposure and development processes to cover the area where the wire does not need to be form, such as opening 312. Thereafter, a conductive material is deposited on the patterned photoresist and the region not covered by the patterned photoresist by a sputtering process. Finally the patterned photoresist is removed to form the second wire 410 and the third wire 420. In some embodiments, a reflective layer 430 may be formed on the other side of the blocking wall 400 while forming the second wire 410 and the third wire 420 to reflect the light emitted from the LED chip 222. In some embodiments, the second wire 410 on the inner sidewall 401 of the blocking wall 400 can also reflect the light emitted from the LED chip 222.

As shown in FIG. 8, the second wire 410 extends from a top surface of the second circuit layer 300 to the inner sidewall 401 and the upper surface 403 of the blocking wall 400. In some examples, the second wire 410 has a length L1 extending to the upper surface 403 of the blocking wall 400, and the length L1 is at least one third of the thickness T1 of the blocking wall 400. By extending the second wire 410 to the upper surface 403 of the blocking wall 400, the sensing sensitivity can be improved. The third wire 420 extends from the top surface of the second circuit layer 300 to the outer sidewall 402 of the blocking wall 400. It should be noted that the second wire 410 and the third wire 420 do not shield the LED chip 222, and therefore the light emitted from the LED chip 222 is not interfered with the second wire 410 and the third wire 420. After the operation 16 is completed, the method 10 of manufacturing the touch-sensing display panel 1000 may further include one or more sub-operations, which will be described in detail below.

Figure 9:
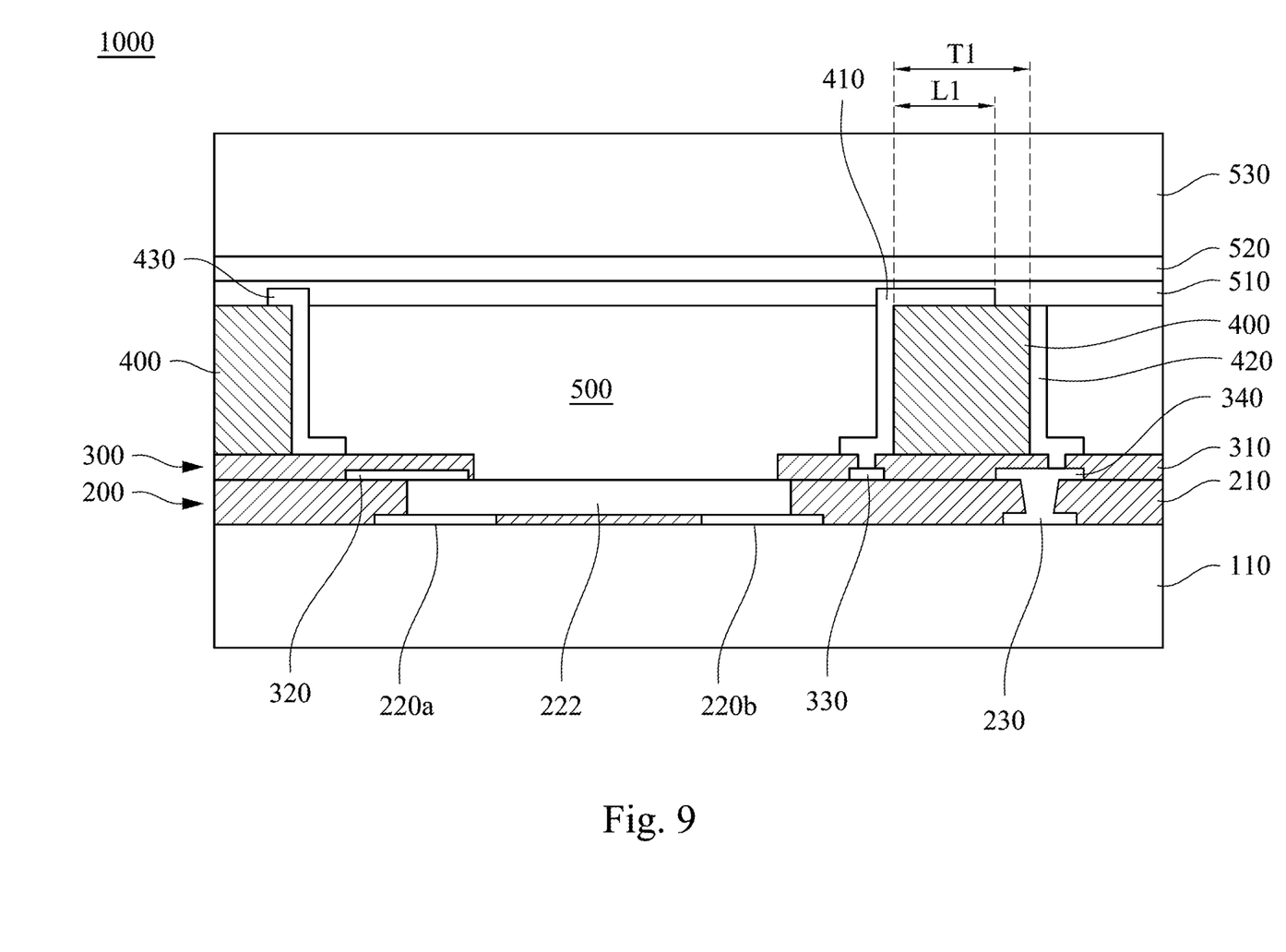

Please refer to FIG. 9, in some embodiments, the method 10 further includes forming an encapsulant layer 500 covering the LED chip 222 exposed by the opening 312. In some embodiments, the encapsulant layer 500 includes light transmissive substrate, such as epoxy, silicone, polyethylene terephthalate (PET), polymethyl methacrylate (PMMA), or a combination thereof, but is not limited thereto. In some examples, the encapsulant layer 500 may include phosphors distributed therein.

Still refer to FIG. 9, in some embodiments, the method 10 further includes forming a blue light barrier layer 510 covering the blocking wall 400, the second wire 410, and the encapsulant layer 500. In some embodiments, the method 10 further includes forming a protective layer 530 on the blocking wall 400 and the second wire 410. In some examples, the protective layer 530 includes glass or plastic, but is not limited thereto. In some embodiments, the protective layer 530 can be adhered to the blue light barrier layer 510 by an optical clear adhesive (OCA).

Please continue to refer to FIG. 9 illustrating the cross-sectional view of the touch-sensing display panel 1000. The touch-sensing display panel 1000 include the substrate 110, the first circuit layer 200, the LED chip 222, the second circuit layer 300, the blocking wall 400, the second wire 410, and the third wire 420. It is understood that the material of the components described above will not be repeated hereinafter. The touch-sensing display panel 1000 may optionally include other elements, which are described hereinafter.

As shown in FIG. 9, the first circuit layer 200 is disposed on the substrate 110. The first circuit layer 200 includes at least one first electrode 220a (or 220b) and a first wire 230. The LED chip 222 is disposed on the first electrodes 220a, 220b and is electrically connected to thereof. The first dielectric material layer 210 covers the first circuit layer 200.

The second circuit layer 300 is disposed on the first circuit layer 200. The second circuit layer 300 includes the second electrode 320, the touch sensing line 330, and the touch driving line 340. Specifically, the second circuit layer 300 is disposed on the substantially flat first dielectric material layer 210 and is covered by the second dielectric material layer 310. The opening 312 (shown in FIG. 8) of the second dielectric material layer 310 exposes the LED chip 222. In some embodiments, the second electrode 320 is electrically connected to the LED chip 222, and the touch driving line 340 is electrically connected to the first wire 230.

The blocking wall 400 is disposed on the second circuit layer 300 and surrounds the LED chip 222. The blocking wall 400 has an inner sidewall 401, an outer sidewall 402, an upper surface 403, and a thickness T1. The inner sidewall 401 of the blocking wall 400 faces to the LED chip 222, the outer sidewall 402 is away from the LED chip 222, and the upper surface 403 interconnects to the inner sidewall 401 and the outer sidewall 402. Specifically, the blocking wall 400 is located on the second dielectric material layer 310 and surrounds the opening 312. In some embodiments, the blocking wall 400 surrounds the opening 312 and defines an accommodating space A1 (shown in FIG. 7), the accommodating space A1 is between the inner sidewalls 401 of blocking wall 400. In some embodiments, the touch-sensing display panel 1000 includes an encapsulant layer 500 filled in the accommodating space A1 and covering the LED chip 222. In some examples, the encapsulant layer 500 includes phosphors distributed therein. In other embodiments, the accommodating space A1 may be a cavity without the encapsulant layer 500.

As shown in FIG. 9, the second wire 410 is disposed on the second circuit layer 300 and extends to the inner sidewall 401 and the upper surface 403 of the blocking wall 400, and the second wire 410 is electrically connected to the touch sensing line 330. The second wire 410 has a length L1 extending to the upper surface 403 of the blocking wall 400, and the length L1 is at least one third of the thickness T1 of the blocking wall 400. The third wire 420 is disposed on the second circuit layer 300 and extends to the outer sidewall 402 of the blocking wall 400, and the third wire 420 is electrically connected to the touch driving line 340.

In some embodiments, the touch-sensing display panel 1000 further includes blue light barrier layer 510 on the blocking wall 400 and the second wire 410. Specifically, the blue light barrier layer 510 may be disposed on the blocking wall 400 and the encapsulant layer 500, and cover the second wire 410 extending to the upper surface 403 of the blocking wall 400. In some embodiments, the touch-sensing display panel 1000 further includes protective layer 530 on the blocking wall 400 and the second wire 410. Specifically, in some examples, the protective layer 530 can be adhered to the blue light barrier layer 510 by an optical clear adhesive.

As described above, according to the embodiments of the present disclosure, a touch-sensing display panel and a method of manufacturing thereof are provided. In the touch-sensing display panel of the present disclosure, the display module circuit and the touch module circuit are integrated on the redistribution layer (RDL). Compared with the current touch-sensing display panel structure, the touch-sensing display panel of the present disclosure needn't attach the touch module and the display module with an additional laminating process, thereby simplifying the process, reducing the cost, and avoiding the display defects of the rainbow pattern of the touch-sensing display panel. In addition, the wires electrically connected to the touch sensing circuit and touch driving circuit are formed along the side wall of the blocking wall without shielding the LED chip. Therefore, the light emitted from the LED chip 222 is not interfered with the wires, and the luminous intensity of the touch-sensing display panel can be increased. The wires electrically connected to the touch sensing circuit and touch driving circuit of the present disclosure can further extend to the upper surface of the blocking wall, such that the sensing sensitivity can be improved.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the invention. In view of the foregoing, it is intended that the present disclosure cover modifications and variations of this invention provided they fall within the scope of the following claims.

What is claimed is:
1. A touch-sensing display panel, comprising:
    a substrate;
    a first circuit layer disposed on the substrate, wherein the first circuit layer comprises at least one first electrode and a first wire;
    a light-emitting diode chip disposed on and electrically connected to the first electrode;
    a second circuit layer disposed on the first circuit layer, wherein the second circuit layer comprises a second electrode, a touch sensing line and a touch driving line, and the touch driving line is electrically connected to the first wire;
    a blocking wall disposed on the second circuit layer and surrounding the light-emitting diode chip, wherein the blocking wall has an inner sidewall, an outer sidewall and an upper surface, and the inner sidewall faces the light-emitting diode chip;

a second wire disposed on the second circuit layer and extending to the inner sidewall and the upper surface of the blocking wall, wherein the second wire is electrically connected to the touch sensing line; and a third wire disposed on the second circuit layer and extending to the outer sidewall of the blocking wall, wherein the third wire is electrically connected to the touch driving line.

2. The touch-sensing display panel of claim 1, further comprising an encapsulant layer between the inner sidewalls of the blocking wall and covering the light-emitting diode chip.

3. The touch-sensing display panel of claim 2, wherein the encapsulant layer comprises phosphor.

4. The touch-sensing display panel of claim 1, further comprising a protective layer on the blocking wall and the second wire.

5. The touch-sensing display panel of claim 1, further comprising a blue light barrier layer on the blocking wall and the second wire.

6. The touch-sensing display panel of claim 1, wherein the blocking wall has a thickness, the second wire has a length extending to the upper surface of the blocking wall, and the length is at least one third of the thickness of the blocking wall.

7. The touch-sensing display panel of claim 1, wherein the light-emitting diode chip is micro light-emitting diode chip.

8. A method of manufacturing a touch-sensing display panel, comprising:

forming a precursor substrate comprising:
a substrate;
a first circuit layer disposed on the substrate, wherein the first circuit layer comprises at least one first electrode and a first wire;
a light-emitting diode chip disposed on and electrically connected to the first electrode; and
a second circuit layer disposed on the first circuit layer, wherein the second circuit layer comprises a second electrode, a touch sensing line and a touch driving line, wherein the second electrode is electrically connected to the light-emitting diode chip, and the touch driving line is electrically connected to the first wire;

forming a blocking wall on the second circuit layer, wherein the blocking wall surrounds the light-emitting diode chip; and forming a second wire and a third wire on the second circuit layer, wherein the second wire is electrically connected to the touch sensing line, and the third wire is electrically connected to the touch driving line.

9. The method of claim 8, wherein the blocking wall has an inner sidewall, an outer sidewall and an upper surface, the second wire extends to the inner sidewall and the upper surface of the blocking wall, and the third wire extends to the outer sidewall of the blocking wall.

10. The method of claim 8, further comprising forming an encapsulant layer covering the light-emitting diode chip.

11. The method of claim 10, wherein the encapsulant layer comprises phosphor.

12. The method of claim 8, further comprising forming a protective layer on the blocking wall and the second wire.

13. The method of claim 8, wherein the blocking wall has a thickness, the second wire has a length extending to an upper surface of the blocking wall, and the length is at least one third of the thickness of the blocking wall.

14. The method of claim 8, wherein forming the precursor substrate comprises:

forming the first electrode and the first wire on the substrate;

forming the light-emitting diode chip on and electrically connected to the first electrode, wherein the light-emitting diode chip has a top surface;

forming a first dielectric material layer on the substrate covering the first electrode and the first wire, wherein the first dielectric material layer has a top surface and a first opening, the top surface of the first dielectric material layer is flush with the top surface of the light-emitting diode chip, and the first opening exposes the first wire;

forming the second electrode, the touch sensing line, and the touch driving line on the first dielectric material layer, wherein the second electrode is electrically connected to the light-emitting diode chip, and the touch driving line is electrically connected to the first wire by a first conductive contact; and forming a second dielectric material layer on the first dielectric material layer, wherein the second dielectric material layer has a second opening, a third opening, and a fourth opening, the second opening exposes the light-emitting diode chip, the third opening exposes the touch sensing line, and the fourth opening exposes the touch driving line.

15. The method of claim 8, wherein the second wire is electrically connected to the touch sensing line by a second conductive contact, and the third wire is electrically connected to the touch driving line by a third conductive contact.

* * * * *